(12) United States Patent
Zhang et al.

(10) Patent No.: US 8,274,161 B2
(45) Date of Patent: Sep. 25, 2012

(54) FLUX-FREE CHIP TO SUBSTRATE JOINT SERIAL LINEAR THERMAL PROCESSOR ARRANGEMENT

(75) Inventors: Jian Zhang, Brookline, MA (US); Chunghsin Lee, Lynnfield, MA (US)

(73) Assignee: SemiGear Inc, Wakefield, MA (US)

( * ) Notice: Subject to any disclaimer, the term of this patent is extended or adjusted under 35 U.S.C. 154(b) by 76 days.

(21) Appl. No.: 12/930,462

(22) Filed: Jan. 7, 2011

(65) Prior Publication Data

US 2011/0215483 A1 Sep. 8, 2011

Related U.S. Application Data

(60) Continuation-in-part of application No. 12/930,203, filed on Dec. 31, 2010, and a continuation-in-part of application No. 12/653,454, filed on Dec. 14, 2009, now Pat. No. 7,982,320, which is a division of application No. 11/482,838, filed on Jul. 7, 2006, now Pat. No. 7,632,750, which is a continuation-in-part of application No. 10/832,782, filed on Apr. 27, 2004, now Pat. No. 7,008,879, which is a division of application No. 10/186,823, filed on Jul. 1, 2002, now Pat. No. 6,827,789.

(51) Int. Cl.
*H01L 23/48* (2006.01)
(52) U.S. Cl. ......... 257/779; 257/E21.508; 257/E21.509; 257/E33.023; 257/E33.026; 438/612; 438/613; 438/615; 228/46; 228/49.5
(58) Field of Classification Search .................. 257/779, 257/E21.508, E21.509, E33.023, E33.026; 438/612, 613, 615; 228/46, 49.5
See application file for complete search history.

(56) References Cited

U.S. PATENT DOCUMENTS

2002/0130164 A1* 9/2002 Matsuki et al. ............... 228/206
* cited by examiner

*Primary Examiner* — A. Sefer
*Assistant Examiner* — Farid Khan
(74) *Attorney, Agent, or Firm* — Don Halgren

(57) ABSTRACT

A linear, serial chip/substrate assembly processing machine for stepwise advancing a pre-assembled chip/die substrate on a support plate through a series of sealable chambers beginning at a loading station and ending up at an unloading station after various melting and vacuuming of chip/substrate components has been stepwise indexed through those various chambers to the final joining thereof.

15 Claims, 3 Drawing Sheets

FLUX-FREE CHIP TO SUBSTRATE JOINT SERIAL LINEAR THERMAL PROCESSOR ARRANGEMENT

BACKGROUND OF THE INVENTION

The present invention relates to an electronic chip and to a method of manufacturing same such as semiconductor substrates and more particularly to a stepwise process of a machine utilized in that manufacture of semiconductor substrates and is a continuation-in-part application of co-pending U.S. patent application Ser. No. 12/930,203 (Semigear-20) filed 31 Dec. 2010, and wherein the present application claims the benefit of Semigear-20, and also is a CIP of Ser. No. 12/653,454; filed Dec. 14, 2009 now U.S. Pat. No. 7,982,320, which is a division of Ser. No. 11/482,838, filed Jul. 7, 2006, now U.S. Pat. No. 7,632,750; which is a CIP of Ser. No. 10/832,782, filed Apr. 27, 2004, now U.S. Pat. No. 7,008,879, which is a division of Ser. No. 10/186,823, filed Jul. 1, 2002, now U.S. Pat. No. 6,827,789; each incorporated herein by reference in the present Application.

FIELD OF THE INVENTION

Description of the Prior Art

Formation of a solder bump on a semiconductor substrate takes place when the semiconductor device is formed during a plating method, a printing method and a solder ball melting method. The solder is melted and joined to the connected material which may be wires and conductors or the like. In most prior art manufacturing methods utilizing solder, flux is used which is deposited on the surface of the terminal and the wiring. The flux typically covers the deposited surface while activating the surface to remove oxides and prevent new oxidation. Typically the solder is melted on the deposited surface and spreads over that surface and in the process, dissolves a portion of the flux. Removal of that flux is one of the problems common to the prior art. The flux in between the die and the substrate is impossible to perfectly clean, thereby reducing the reliability of the device produced.

Prior art machines are typically flux dispensers, reflow furnaces, and flux washers. Each particular solder material is often required to use a different flux and a different flux washing chemistry. Due to the nature of these materials and the chemicals, the machines of the prior art had to be designed to be suitable for the particular material and the particular chemistries. Due to the nature of fluxes utilized in the prior art, they adhere to the processing equipment and make that equipment very difficult to be cleaned. The use of fluxes requires a lot of chemical consumption and a lot of maintenance for the manufacturing process.

In some cases, the vacuum system was utilized to heat the solder, to inject formic acid, and to minimize the voids and also form solder bumps or balls. By using a vacuum system for solder reflow, there are several disadvantages, such as the lack of heat transfer media. The heat transfer coefficient of solder is low, and low concentration of formic acid can be used to reduce the surface oxides, and no convection heat transfer can be used to form solder bumps or balls.

It is an object of the present invention to overcome the disadvantages of the prior art.

It is a further object of the present invention to minimize the steps of production which would otherwise be required for flux application and removal.

It is a further object of the present invention to provide a space-saving, step minimizing, linearly advancable manufacturing arrangement for loading, processing and unloading a series of substrates and dies in a series of adjustably controlled, individually processing, generally linearly arranged chambers for efficient chip development.

BRIEF SUMMARY OF THE INVENTION

The present invention relates to a method of manufacturing solder bumps and solder joints on a semiconductor material. The process in one aspect, involves the use of a treatment system comprising a linearly arranged sequence of substrate component treatment stations, comprising a production table having at least six in-line treatment stations or positions thereon, and an "untreated-component" loading station and a "treated-component" unloading station, which stations may include mechanisms shown in commonly owned U.S. Pat. Nos. 6,827,789 and 7,008,879 and 7,358,175, each of which are incorporated herein by reference.

The linear production disclosed herein is arranged to shuttle components, so as to present a pre-assembled material component to be treated, such as a semiconductor substrate, at a series of adjacent spaced-apart station locations which each individually control the temperature, pressure and atmosphere thereat, as may be seen in various aspects and embodiments in the above-identified '789 and '879 patents, incorporated by reference herein.

The initial station where such devices such as the semiconductor chip/die substrate assemblies are loaded, are designated as the Load/Lock station for the purposes of defining a particular aspect of this invention. At the Load/Lock station, a combination of a substrate with a pre-attached but unsoldered die vertically thereadjacent, is loaded onto a support plate and subsequently enclosed within an enclosed climate controlled chamber or housing at the existing ambient atmospheric pressure, and purged by nitrogen to reduce the amount of oxygen within the housing or chamber. The substrate having solder pads thereon and the chip or die having contiguous solder bumps co-aligned thereon with one another in the Load/Lock chamber are tepidly pre-attached to one another by for example, thermal energy or ultrasound energy. That wafer/die loaded plate is then shuttled to the next position designated station #1.

At station #1, a vacuum is applied to the pre-heated chamber, at a temperature of between about 150 to 270° C., and held at a temperature below the melting point of the particular solder utilized in the components of the pre-assembled substrate and chip or die assembly, under a vacuum of about 10 m torr to about 300 torr for about 10 to about 300 seconds, to remove trapped air, moisture, oxygen and by products from the chemical reaction, and then the station #1 undergoes a formic acid vapor and nitrogen vent for the purpose of having formic acid vapor at the juncture or interface of the components therein.

The support plate containing the substrate and chip or die assembly is lowered from its enclosure housing and then shuttled to the next position or subsequent station, which is designated station #2. At station 2, a vacuum is applied to the pre-heated chamber, at a temperature of between about 150 to 270° C., which temperature is held above the melting point of the particular solder utilized in the pre-assembled substrate and chip or die assembly, under a vacuum of about 10 m torr to about 300 torr for about 10 to about 300 seconds, to remove trapped air, moisture, oxygen and chemical reaction by-products, and then the station #2 undergoes a formic acid vapor and nitrogen vent for the purpose of having formic acid vapor at the juncture or interface of the components therein.

The processing temperatures at these stations is controlled and regulated based upon the nature of the particular solder utilized/required for a particular run of substrate/semiconductors.

The chip/die and substrate assembly on the plate thus leaves station #2 and is stepwise shuttled to the housing or chamber of subsequent station #3 by proper controlled linear advancement of the mechanism on which the support plate is disposed. In station #3, a vacuum is applied to the pre-heated chamber, at a temperature of between about 150 to 270° C., which temperature is above the melting temperature of the particular solder utilized in the pre-assembled substrate and chip or die assembly, and the vacuum applied being about 10 m torr to about 300 torr for about 10 to about 300 seconds, to remove trapped air, moisture, oxygen and chemical reaction by-products, and then the station #3 undergoes a formic acid vapor and nitrogen vent for the purpose of having formic acid vapor at the juncture or interface of the components therein.

The chip/die and substrate assembly on the plate thus leaves station #3 and is stepwise linearly shuttled to subsequent station #4 by proper controlled linear advancement of the mechanism on which the support plate is disposed.

The atmosphere in station #4 continues the process begun at station #1, station #2 and station #3, wherein the pre-assembly in the chamber at station #4 a vacuum is applied to the pre-heated chamber, at a temperature of between about 150 to 270° C., containing the pre-assembled substrate and chip or die assembly, under a vacuum of about 10 m torr to about 300 torr for about 10 to about 300 seconds, to remove trapped air, moisture, oxygen and chemical reaction by-products, and then the station #4 undergoes a formic acid vapor and nitrogen vent for the purpose of having formic acid vapor at the juncture or interface of the components therein.

Thereafter, the chip/die and substrate assembly on the support plate in station #4 is lowered from its chamber and is stepwise linearly advanced by a proper shuttle mechanism to a subsequent adjacent solder melting station #5, by controlled shuttling of the support plate on which the substrate/die assembly is disposed.

The temperature in station #5 is held to a particular peak set temperature of between 150° C. to 270° C., wherein the chip/die and substrate assembly is heated above its proper solder melting temperature for an extended period of time of between about 10 to about 300 seconds, by a proper solder melting means in a controlled manner, depending upon the requirements of the particular solder compound for the final electrically joined substrate/die assembly. The chamber at #5 may be vacuumed and vented with nitrogen for the purpose of controlling stress, and to introduce formic acid vapor to the joint interface.

Thereafter, the joined chip or die and substrate assembly on its support plate is caused to stepwardly depart station #5 and is stepwise shuttled to a subsequent cooling station #6, by controlled advancement of the support plate on which the substrate/die assembly is disposed.

The atmosphere in station #6 changes the process of station #5 wherein the atmosphere at station #6 is chilled by a proper chilling arrangement therewith, to a set temperature of between about 20° C. to 30° C., or about room temperature, or lower, for a period of time of between about 10 to about 300 seconds, so as to cool the now electrically/mechanically joined solder mating the chip or die and the substrate together, prior to its transfer to the Load/Lock station for removal therefrom, and for its subsequent further manufacturing processes therewith.

The final step within the serial thermal processing portion of this wafer treatment thus occurs when the substrate assembly is sequentially shuttled to the final or substrate assembly Un-Load/Lock station, where the joined, treated chip or die and substrate assembly or substrate is unloaded from its support plate in that last chamber.

A new untreated substrate assembly is placed on a support plate at the upstream Load/Lock station for its further sequential stepped advance through the stations #1 through station #5 on the treatment apparatus, after the previous chip or die and substrate assemblies have been indexedly shuttled to their next successive stations. The process permits a number of substrate assemblies to go through the process simultaneously, as each substrate assembly is stepped downstream to its/their next in-line station.

The processing parameters at each particular station are set so to cover all particular solders which may include high lead, eutectic, and lead free solder.

The treatment details of the system thus include:

Load/Lock station: a pre-assembled (solder unmelted) chip or die on a substrate which is loaded onto a support plate in the Load station or chamber, at room or ambient temperature, is purged with nitrogen to reduce moisture and oxygen therewithin, whereupon it is shuttled to the first process station designated station #1;

Pre-heating the initial chamber at station #1 to a temperature which may be below the solder melting point, and vacuuming at station #1, then formic acid purging to remove oxides at the assembly interface, and refill the chamber with a formic acid vapor mixture, for the purpose of having the formic acid vapor filling the joint interface, and shuttling the assembly to station #2;

Heating and vacuuming at the next station (#2) at a temperature which may be above the melting point of the solder, vacuuming the chamber and purging the chamber with a formic acid vapor for the purpose of oxide reduction, and shuttling the assembly to the next station #3;

Heating and vacuuming at the next station (#3) at a temperature preferably above the melting point of the solder, vacuuming in the chamber and purging the chamber with any formic acid vapor for the purpose of oxide reduction, and shuttling the assembly to the next station #4;

Heating and applying a vacuum at station #4 at a temperature of between 150° C. and 270° C., preferably above the melting point of the solder, applying a vacuum to the chamber and purging the chamber with formic acid vapor for the purpose of oxide reduction, then shuttling the substrate assembly to station #5.

Heating and vacuuming at the next station (#5) at a peak high temperature between 150° C. and 270° C. clearly above the melting point of the solder, and vacuuming the chamber to remove any voids, and shuttling the assembly to the next station #6;

Chilling the now joined preassembly and vacuuming the chamber at station #6 to about 20° C. to 30° C., to vent with formic acid vapor and nitrogen to control stress and move formic acid vapor to the joint interface, and shuttling the assembly to the final (Un) Lock/Load station;

The cooled, fully joined substrate assembly is at or near room temperature for its arrival at the next or Unload/Lock station, wherein the shuttled, cooled, joined assembly linearly downstream is unloaded therefrom as the now joined substrate assembly.

The reflowing of high lead, eutectic and lead free solders are completed with one treatment of formic acid, wherein that substrate configuration is treated by the introduction of formic acid into the chambers at certain stations at atmospheric pressure. Removal or minimizing the voids inside the solder during the solder reflow by the application of a vacuum occurs after the surface oxides have been reduced and the solder has been melted.

The present invention however, requires only one chemical, such as a formic acid, to effectively reduce the surface oxides of lead, tin, copper, silver and indium. The formic acid may also be utilized to reduce surface oxides of high lead solders such as lead and tin compounds, eutectic solders, and lead free solder as well as silver, tin or silver, copper and indium compounds.

Such a lead-free solder, such as for example, SnAg (tin/silver) has a melting temperature (mT) of 217° C., and the formic acid reaction temperature is between 180° C. to 200° C., and may be used with the method of the present invention.

By using a stepped, independent, multi-chamber linearly aligned machine such as utilized with the present invention, removal of moisture on the surface can be easily accomplished. Removal of surface oxides or the minimization of voids inside the solder bumps or balls may be accomplished. By applying formic acid at or above atmospheric pressure, a large amount of formic acid molecules are thus available for the oxide reduction process. It is critical to vacuum and apply a formic acid vapor charge and vent before melting the solder in the assembly By also applying the formic acid at or above atmospheric pressure, mechanical system for delivery of the chemical is easy and controllable. Because of the pressure utilized, the heating system is able to permit uniformed and controlled heating of a substrate or semiconductor assembly thereon. Under atmospheric pressure, the transferring of heat away from the heating system to the solder is more efficient. This is especially true because the substrate size in modern semiconductor manufacturing is much larger and the system requirements are much higher.

The formation of solder bump and ball joints are formed in a improved manner when it is done so at or above atmospheric pressure because the conduction by heating or cooling can be accomplished more efficiently. The initial heating and cooling of solder bumps or balls at atmospheric pressure and subsequent heating and applying of a vacuum at elevated temperatures permits the pressure inside of the voids to draw those voids to the surface. Such voids are then easily removed.

BRIEF DESCRIPTION OF THE DRAWINGS

The objects and advantages of the present invention will become more apparent when viewed in conjunction with the following drawings, in which.

DETAILED DESCRIPTION OF THE PRESENT INVENTION

Figure 1:
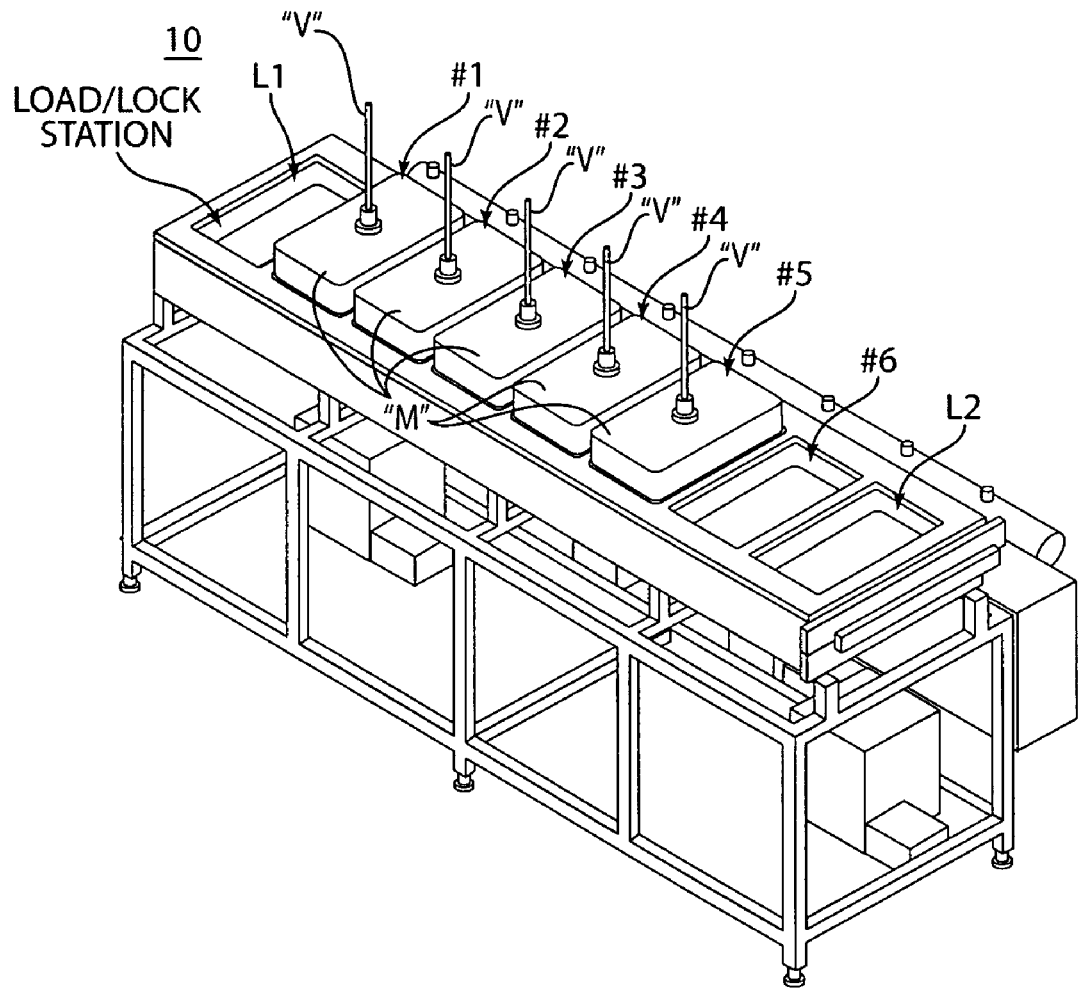
FIG. 1 is a perspective view of the linear substrate assembly processing apparatus of the present invention.

The invention comprises an electronic chip made by a chip manufacturing process which comprises a stepwise and linearly arranged, serial thermal processing station arrangement 10 using a method for serially treating a pre-assembled chip or die and a substrate assembly "W" through a series of at least six independent, enclosed station chambers and an initial load/lock chamber and a final unload/lock chamber, in the processor arrangement 10, as represented in FIG. 1.

The linear production station arrangement 10 represented in FIG. 1 is arranged to stepwise present a material to be treated, such as a semiconductor substrate assembly, at a series of linearly aligned, spaced-apart locations, from an initial Load/Lock station to processing stations numbered herein, for example, numbers 1 through 6, which stations each are arranged to independently control the temperature, pressure and atmosphere thereat, as is similarly represented in various aspects and embodiments of the arrangement 10, in a mechanism as may, for example, be shown in the above-identified '789 and '879 patents, incorporated by reference herein. It is to be noted that additional processing chambers or stations may be included within certain aspects of the present invention.

Figure 2:
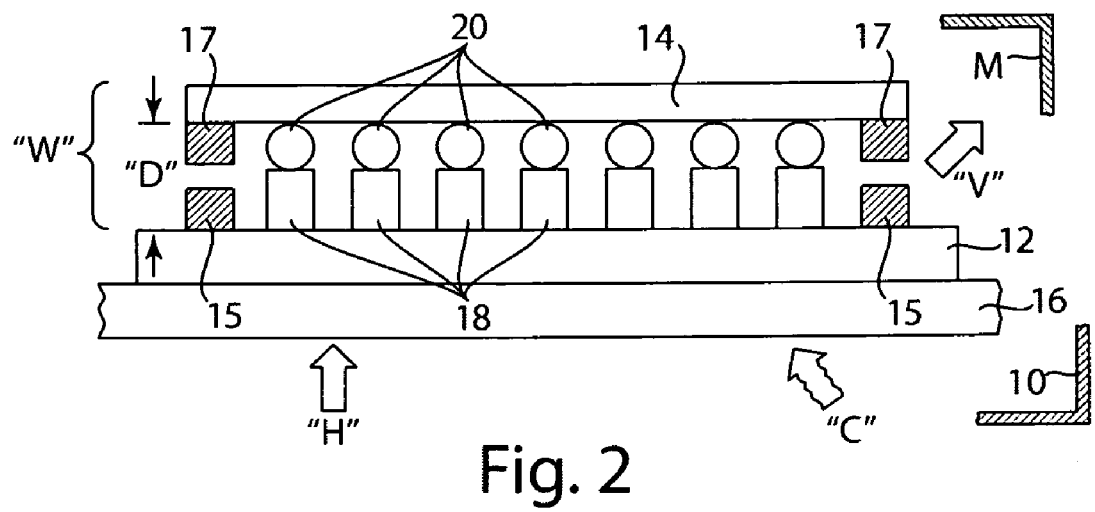
FIG. 2 is a side elevation representation of a chip or die disposed above a chip or die and a substrate with a solder arrangement therebetween, undergoing a first step of the inventive process.
Figure 3:
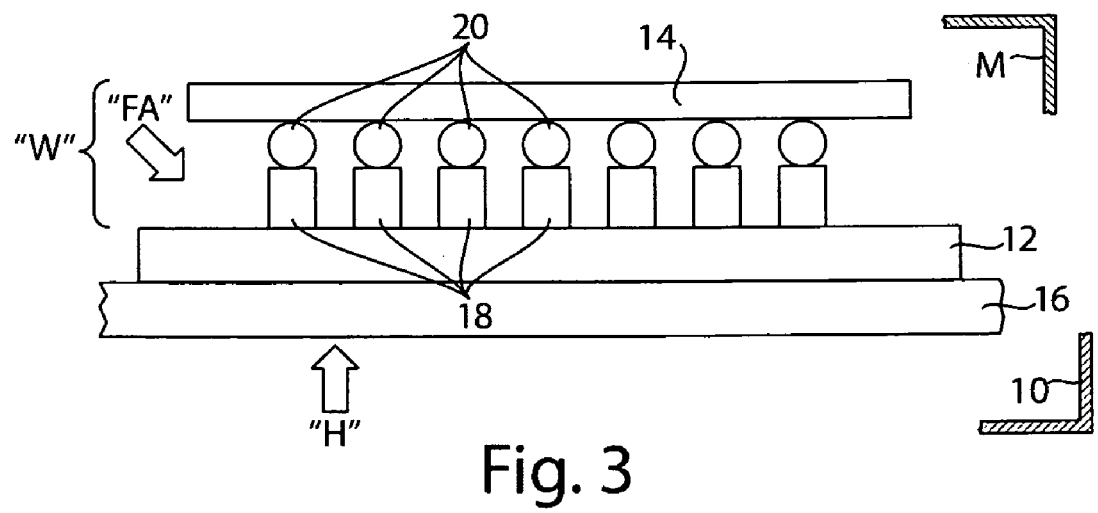
FIG. 3 is a side elevation representation similar to that shown in FIG. 2 when a chip or die and a substrate assembly are undergoing a second step of the inventive process of the present invention.
Figure 4:
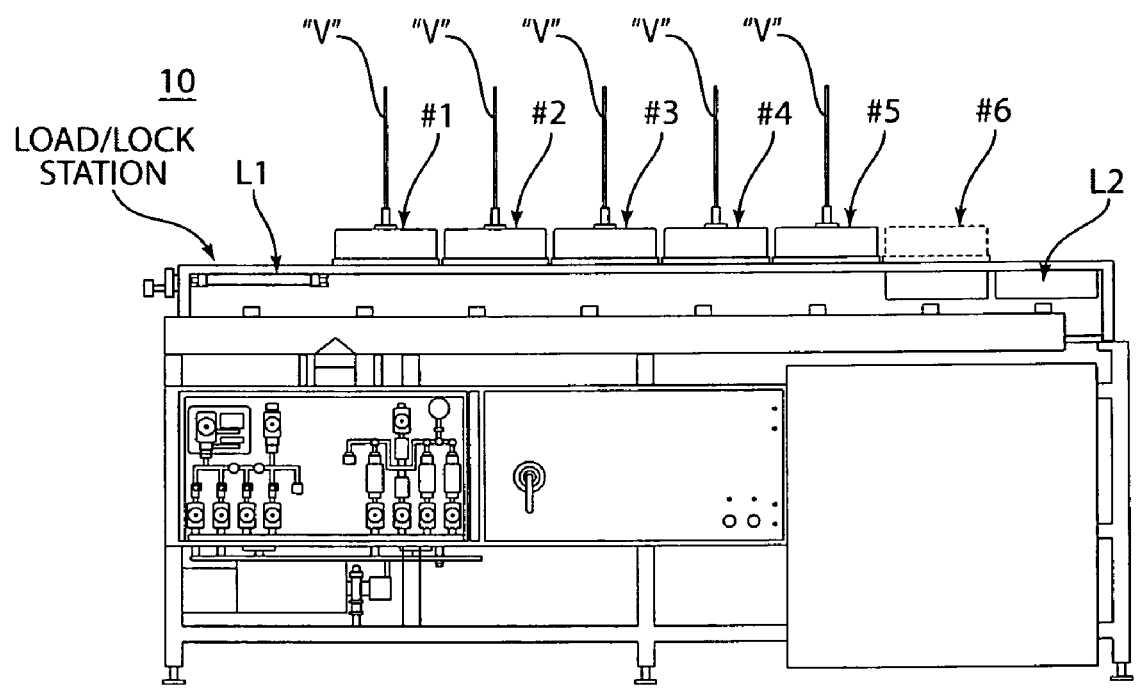
FIG. 4 is a side elevation view of the processing apparatus shown in FIG. 1.

FIG. 1 represents the initial station L1, where such devices such as the semiconductor chip/die substrate assemblies "W", as represented in FIGS. 2 and 3, are loaded, for the purposes of defining a particular aspect of this invention. At that Load/Lock station L1, a combination of a substrate assembly 12, with a pre-attached chip or die 14, as represented in FIGS. 2 and 3, is loaded onto a properly shuttleable support plate 16 and subsequently enclosed within an enclosed climate controlled chamber or housing M at the existing ambient or atmospheric pressure of the processing arrangement 10. The substrate 12 has solder pads 18 pre-arranged thereon and the chip or die 14 has contiguous solder bumps 20 co-aligned and pre-arranged thereon, which are "tepidly" pre-attached to one another, by for example, thermal energy or ultrasound energy, prior to their placement onto the support plate into the Load/Lock station of the processing arrangement 10. The chip or die 14 and the substrate 12 are typically spaced apart a distance "D" of about 10 to 500 microns from one another in this assembly process.

From the Load/Lock position, the assembly W is shuttled to the first processing chamber at station #1, wherein a vacuum is then applied to the pre-heated chamber, at a set temperature of between about 150 to 270° C., by a proper heating means "H" and which may, in one preferred aspect of the invention, be held at a set temperature just below the melting point of the particular solder utilized in the components of the pre-assembled substrate and chip or die assembly "W", under a vacuum of about 10 m torr to about 300 torr for about 10 to about 300 seconds, to remove trapped air, moisture, oxygen and by-products of the chemical reaction, and then the station #1 undergoes a formic acid vapor charge FA, by proper means, and a nitrogen vent "V", by proper means, for the purpose of having formic acid vapor at the juncture or interface of the components therein. The assembly "W" is heated by a proper heating means "H" to a set temperature (dependent upon the nature of the solder) of between 150° C. to about 270° C., as represented in FIGS. 2 and 3, which assembly "W" then undergoes a charge of formic acid FA represented in FIG. 3, and a vent "V" of nitrogen, to atmosphere, as represented in FIG. 2.

The support plate 16 containing the substrate and chip or die assembly W is then stepwise indexed to the next position or next subsequent station, which is designated station #2.

At station #2, a vacuum is applied to the pre-heated chamber "M", at a temperature of between about 150° C. to about 270° C., which temperature is, in one aspect of the present invention, preferably held above the melting point of the particular solder utilized in the pre-assembled substrate and chip or die assembly "W", under a vacuum of about 10 m torr to about 300 torr for about 10 to about 300 seconds, to remove trapped air, moisture, oxygen and reaction by-products, and then the station #2 undergoes a formic acid vapor FA introduction and a nitrogen vent "V" for the purpose of having formic acid vapor at the juncture or interface of the components therein.

The processing temperatures and atmospheres at these stations is controlled and regulated based upon the nature of the particular solder utilized/required for a particular run of substrate/semiconductor assemblies.

The atmosphere in the chambers is vented with formic acid FA vapor to remove oxides, as represented in FIG. 3. The chip/die and substrate assembly "W" on the support plate 16 within the chambers is also heated "H" by convection and/or conduction in a controlled manner at a temperature between about 150° C. to about 270° C., as represented in FIG. 2. The processing temperatures at the stations #2, #3, #4, #5 (and any other stations in other aspects of the invention) are controlled and regulated based upon the nature of the solder utilized for a particular run of substrate/semiconductor assemblies.

The chip/die and substrate assembly "W" on the plate 16 thus leaves station #2 and is properly stepwise shuttled to a subsequent station #3 by controlled shuttling of the support plate 16.

In station #3, a vacuum is applied to the pre-heated chamber "M", at a temperature of between about 150 to 270° C., which temperature in one aspect of the present invention, is preferably above the melting temperature of the particular solder utilized in the pre-assembled substrate and chip or die assembly, and the vacuum applied being about 10 m torr to about 300 torr for about 10 to about 300 seconds, to remove trapped air, moisture, oxygen and reaction by-products, and then the station #3 undergoes a proper charge of formic acid vapor and a proper nitrogen vent for the purpose of having formic acid vapor at the juncture or interface of the components therein.

The chip/die and substrate assembly "W", on the plate 16 thus leaves station #3 and is properly stepwise linearly shuttled to subsequent station #4 by proper controlled linear advancement of the mechanism on which the support plate is disposed.

The pre-assembly "W" in the chamber at station #4 is received at a set temperature, in one aspect of the present invention, preferably above the melting temperature of the particular solder utilized herein, which is typically between about 150° C. to about 270° C., containing the pre-assembled substrate and chip or die assembly "W", and under a vacuum of about 10 m torr to about 300 torr for about 10 to about 300 seconds, to further remove trapped air, moisture, oxygen and reaction by-products therefrom. Then the station #4 undergoes a proper formic acid "FA" vapor charge and a proper nitrogen vent "V" for the purpose of having formic acid vapor at the juncture or interface of the components therein.

Thereafter. the chip or die and substrate assembly "W" on the plate 16 is caused to stepwardly depart station #4 and is advanced to a subsequent heating station #5 by controlled, stepped, linear advancement on which the support plate 16 is disposed.

The temperature in station #5 is heated to a peak temperature above the melting temperature of the particular solder, such as for example, above 217° C., (for SnAg solder) to create a strong electrically conductive mechanical joint between the components (18 and 20) of the assembly W, the temperature being held for an extended period of time of between about 10 to about 300 seconds, by a proper heating means "H", in a controlled manner, depending upon the requirements of the particular solder compound for the final heating and melting together to produce a electrically joined substrate/die assembly. The chamber at #5 may also have a vacuum applied and then vented with nitrogen for the purpose of controlling stress, and to introduce formic acid vapor to the joint interface, whereupon the assembly "W" is then shuttled to station #6.

The atmosphere in station #6 changes the process of station #5 wherein the atmosphere within the station #6 is chilled by a proper chilling arrangement "C", to a temperature of between about 20° C. to 30° C., or about room temperature, or lower, for a period of time of between about 10 to about 300 seconds, so as to cool the solder mating the chip or die and substrate assembly "W" together, prior to its proper shuttled transfer to the final Load/Lock station for removal (unloading) therefrom, and for any subsequent further manufacturing processes therewith.

The final step within the serial thermal processing portion of this semiconductor treatment occurs when the wafer die/chip and substrate assembly W is sequentially advanced to the last Load/Lock station L2 where the joined and treated chip or die and substrate assembly "W" is unloaded from its final chamber.

The processing parameters at each particular station are set so to cover all particular solders which may include high lead, eutectic, and lead free solder.

The invention claimed is:

1. A serial thermal processing arrangement for treating a pre-assembled chip/substrate assembly of spaced-apart, pre-soldered semiconductor components in a linear chip processor, through a series of independent, linearly adjacent chambers, wherein:

a pre-assembled chip/substrate is loaded onto a support plate in a chamber at an initial Load/Lock station of the processor, the pre-assembled chip/substrate being held at atmospheric pressure, and the chamber is purged with nitrogen gas;

the pre-assembled chip/substrate is advanced into a first treatment chamber or station, and the pre-assembled chip/substrate assembly is heated to a pre-set temperature of from about 150° C. to about 270° C. for a particular solder utilized, wherein the first chamber is held below atmospheric pressure, and a formic acid vapor vent is introduced to the chamber;

the pre-assembled chip/substrate assembly is advanced to a second chamber or station, the pre-assembled chip/substrate assembly is heated to a pre-set temperature of from about 150° C. to about 270° C. for the particular solder utilized, while holding the second chamber at a vacuum, and a formic acid vapor vent is introduced into the second chamber;

the pre-assembled chip/substrate assembly is advanced from the second station to a third chamber or station, the pre-assembled chip/substrate assembly is heated to a pre-set temperature of from about 150° C. to about 270° C. for the particular solder utilized therewith and is held to a vacuum, and a formic acid vapor vent is introduced to the chamber;

the pre-assembled chip/substrate assembly is advanced from the third station to a fourth station, and the pre-assembled chip/wafer assembly is heated at a pre-set temperature of from about 150° C. to about 270° C. for the particular solder utilized between the spaced-apart chip and substrate to electrically join the solder of the chip and the substrate, a formic acid vapor vent being introduced to the chamber;

the pre-assembled chip/substrate assembly is advanced from the fourth station to a fifth station, and the pre-assembled chip/wafer assembly is heated at a pre-set peak temperature of from about 150° C. to about 270° C. for the particular solder utilized between the spaced-apart chip and substrate to fully electrically and mechanically join the solder of the chip and the substrate, a formic acid vapor vent being introduced to the chamber;

the joined chip/substrate assembly is advanced from the fifth station to a sixth station for cooling the now joined and electrically conductive components of the assembly at ambient or room temperature of about 20° C. to about 30° C.; and the chip/substrate assembly is shuttled to a final downstream Load/Lock station for unloading the joined chip/substrate assembly from the chamber at the Load/Lock station.

2. The serial thermal processing arrangement as recited in claim 1, wherein the first station is heated at a set temperature below the melting point of the solder from about 150° C. to about 270° C.

3. The serial thermal processing arrangement as recited in claim 1, wherein the first and second stations are held at a vacuum for about 10 to about 300 seconds.

4. The serial thermal processing arrangement as recited in claim 1, wherein the first, the second and the third linearly adjacent stations each utilize similar time, pressure and temperature treatment parameters available therein.

5. The serial thermal processing arrangement as recited in claim 1, wherein the fourth station is heated to a temperature above the melting temperature of the solder utilized, which temperature is selected between about 150° C. to about 270° C., as necessary for the particular solder utilized.

6. The serial thermal processing arrangement as recited in claim 1, wherein the initial Load/Lock station is purged with nitrogen for a period of about 10 to about 60 seconds.

7. The serial thermal processing arrangement as recited in claim 1, wherein the third station is heated to a temperature of between about 150° C. to about 270° C., which temperature is above the melting point of the particular solder utilized, holding that temperature for a time of about 10 to about 300 seconds.

8. The serial thermal processing arrangement as recited in claim 1, wherein the fifth station is heated to a peak solder set melting temperature between about 150° C. to about 270° C., which temperature is above the melting temperature of the particular solder utilized, at a pressure of about 760 torr for a period of about 10 to about 300 seconds.

9. The serial thermal processing arrangement as recited in claim 1, wherein the sixth station chills the chip/substrate assembly to about 10° C. to about 30° C. for a period of time about 10 to about 300 seconds.

10. A flux-free, serial thermal processing arrangement for treating a pre-assembled chip/substrate assembly of spaced-apart, pre-soldered semiconductor components in a linear chip processor, through a series of independent, linearly adjacent chambers, wherein:

the pre-assembled chip/substrate is loaded onto a support plate in a chamber at an initial Load/Lock station of the processor, the pre-assembled chip/substrate being held at atmospheric pressure, and the chamber is purged with nitrogen gas;

the pre-assembled chip/substrate is advanced into a first treatment chamber or station, and the pre-assembled chip/substrate assembly is heated to below solder melt temperature, the first chamber being held below atmospheric pressure, and formic acid vapor vent is introduced therein;

the pre-assembled chip/substrate assembly is advanced to a second chamber or station, the pre-assembled chip/substrate assembly being heated to a temperature above the melting temperature of the solder, the second chamber being held at a vacuum, and a formic acid vapor vent is then introduced;

the pre-assembled chip/substrate assembly is advanced from the second station to a third chamber or station, the pre-assembled chip/substrate assembly is heated to a temperature above the melting point of the solder, then holding a vacuum, and a formic acid vapor vent is introduced to the chamber;

the pre-assembled chip/substrate assembly is advanced from the third station to a fourth station, and the pre-assembled chip/wafer assembly is heated at an elevated solder-melt temperature to further melt the solder between the spaced-apart chip and substrate to electrically join the solder of the chip and the substrate, a formic acid vapor vent then being introduced to the chamber;

the heated, joined chip/substrate assembly is advanced to a fifth station, and the now pre-assembled chip/substrate assembly is heated to a peak temperature of from about 150° C. to about 270° C., with an applied vacuum and the chamber is vented with nitrogen;

the joined chip/substrate assembly is advanced from the fifth station to a sixth station and is cooled at ambient or room temperature; and the chip/substrate assembly is shuttled to a final downstream Load/Lock station for unloading the joined chip/substrate assembly from the chamber at the Load/Lock station; wherein the first, second, third stations and fourth are each individually heated to a pre-set temperature of from about 150° C. to about 270° C., and wherein the fifth station is heated to a highest peak solder melting temperature of the series of stations, at a pressure of about 760 torr for a period of about 10 to about 300 seconds.

11. An electronic semiconductor component manufactured by a flux-free, serial thermal processing arrangement for sequentially treating a pre-assembled chip/substrate assembly of spaced-apart, pre-soldered semiconductor components in a linear chip processor, through a series of independent, linearly adjacent chambers, wherein:

the pre-assembled chip/substrate is loaded onto a support plate in a chamber at an initial Load/Lock station of the processor, the pre-assembled chip/substrate being held at atmospheric pressure, and the chamber is purged with nitrogen gas;

the pre-assembled chip/substrate is advanced into a first treatment chamber or station, and the pre-assembled chip/substrate assembly is heated to below solder melt temperature, the first chamber being held below atmospheric pressure, and a formic acid vapor vent is introduced;

the pre-assembled chip/substrate assembly is advanced to a second chamber or station, the pre-assembled chip/substrate assembly is heated to a temperature above the melting temperature of the solder, the second chamber being held at a vacuum, and a formic acid vapor vent is introduced the chamber;

the pre-assembled chip/substrate assembly is advanced from the second station to a third chamber or station, the pre-assembled chip/substrate assembly is heated to a temperature above the melting point of the solder, held to a vacuum, and a formic acid vapor vent is introduced to the chamber;

the pre-assembled chip/substrate assembly is advanced from the third station to a fourth station, and the pre-assembled chip/wafer assembly is heated at an elevated temperature to further treat the solder between the spaced-apart chip and substrate to electrically join the solder of the chip and the substrate, and a formic acid vapor vent is introduced to the chamber;

the heated, joined chip/substrate assembly is advanced to a fifth station, and the assembly is heated to a peak solder melt temperature of from about 150° C. to about 270° C. to melt and join the pre-assembled chip/substrate assembly under a vacuum, wherein the chamber is vented with nitrogen;

the joined chip/substrate assembly is advanced from the fifth station to a sixth station and cooled at ambient or room temperature; and the chip/substrate assembly is shuttled to a final downstream Load/Lock station, the joined chip/substrate assembly is unloaded from the chamber at the Load/Lock station; wherein the first, second, third and fourth stations are each individually heated to a pre-set temperature of from about 150° C. to about 270° C., and at a pressure of about 760 torr for a period of about 10 to about 300 seconds.

12. The serial thermal processing arrangement as recited in claim 1, wherein the pre-set temperature of stations 1 through 4 are each held at a temperature below the melting of the particular solder utilized in the assembly.

13. The serial thermal processing arrangement as recited in claim 1, wherein the pre-set temperature of stations 1 through 5 are held at a temperature above the melting point of the particular solder utilized in the assembly.

14. The serial thermal processing arrangement as recited in claim 1, wherein the pre-set temperature of stations 1 and 2 are held at a temperature below the melting point of the particular solder utilized in the assembly, and stations 3 and 4 and 5 are held at a temperature above the melting point of the particular solder utilized in the assembly.

15. The serial thermal processing arrangement as recited in claim 1, wherein the pre-set temperature of station 5 is held at a peak temperature of all the stations in the processing arrangement, and above the melting point of the particular solder utilized in the assembly.

* * * * *